US012117375B2

(12) United States Patent
Glennon et al.

(10) Patent No.: US 12,117,375 B2
(45) Date of Patent: *Oct. 15, 2024

(54) MACHINE HEALTH MONITORING

(71) Applicant: Everactive, Inc., Santa Clara, CA (US)

(72) Inventors: Ashley Belle Glennon, Charlottesville, VA (US); Michael I. Fuller, Apex, NC (US); Shadi Hawawini, Mountain View, CA (US)

(73) Assignee: Everactive, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/446,409

(22) Filed: Aug. 30, 2021

(65) Prior Publication Data

US 2021/0389214 A1 Dec. 16, 2021

Related U.S. Application Data

(63) Continuation of application No. 16/665,767, filed on Oct. 28, 2019.

(51) Int. Cl.
| | |
|---|---|
| *G06F 11/30* | (2006.01) |
| *G01M 13/028* | (2019.01) |
| *G01M 99/00* | (2011.01) |
| *H02J 50/00* | (2016.01) |
| *H02J 3/38* | (2006.01) |
| *H10N 10/00* | (2023.01) |

(52) U.S. Cl.
CPC ........ *G01M 99/008* (2013.01); *G01M 13/028* (2013.01); *H02J 50/001* (2020.01); *H02J 3/381* (2013.01); *H02J 2300/24* (2020.01); *H10N 10/00* (2023.02)

(58) Field of Classification Search
CPC .................................................. G01M 99/008
See application file for complete search history.

(56) References Cited

U.S. PATENT DOCUMENTS

| | | |
|---|---|---|
| 8,935,126 B2 | 1/2015 | Armstrong et al. |
| 9,020,456 B2 | 4/2015 | Wentzloff et al. |
| 9,413,403 B2 | 8/2016 | Wentzloff et al. |
| 9,913,006 B1 | 3/2018 | Wascat et al. |
| 2014/0269563 A1 | 9/2014 | Wentzloff et al. |
| 2016/0037486 A1 | 2/2016 | Wentzloff et al. |
| 2017/0199101 A1 | 7/2017 | Franchitti |

(Continued)

FOREIGN PATENT DOCUMENTS

CN           105203203        12/2015

OTHER PUBLICATIONS

"Energy Harvesting Applications" Emerson Global Users Exchange, Presentation, Oct. 2, 2017, 26 pages.

(Continued)

*Primary Examiner* — Phuong Huynh
(74) *Attorney, Agent, or Firm* — Weaver Austin Villeneuve & Sampson LLP

(57) ABSTRACT

Devices, systems, and techniques are described that relate to the monitoring of various types of components in industrial systems. These include battery-less monitors that run on power harvested from their environments, systems for acquiring monitor data for the components in a facility, and/or techniques for processing monitor data to reliably determine the status of individual components and other system parameters.

29 Claims, 6 Drawing Sheets

(56) References Cited

U.S. PATENT DOCUMENTS

| | | | | |
|---|---|---|---|---|
| 2018/0025603 A1* | 1/2018 | Tyler | ............ | H04W 52/0212 |
| | | | | 340/572.1 |
| 2019/0121350 A1 | 4/2019 | Cella et al. | | |
| 2020/0182684 A1* | 6/2020 | Yoskovitz | ............ | G01R 33/02 |
| 2020/0292506 A1* | 9/2020 | Hayzen | ............ | G01N 29/14 |
| 2020/0344962 A1 | 11/2020 | Wright et al. | | |
| 2021/0123835 A1 | 4/2021 | Glennon et al. | | |
| 2021/0199534 A1* | 7/2021 | Bidwell | ............ | G01M 7/025 |

OTHER PUBLICATIONS

US Notice of Allowance dated Jun. 16, 2021 issued in U.S. Appl. No. 16/665,767.
PCT International Preliminary Report on Patentability and Written Opinion dated Feb. 4, 2021, issued in Application No. PCT/US2020/055601.
International Preliminary Report on Patentability dated May 12, 2022 in PCT Application No. PCT/US2020/055601.
U.S. Notice of Allowance dated Aug. 22, 2022 in U.S. Appl. No. 16/665,767.
U.S. Non Final Office Action dated Feb. 15, 2022, in U.S. Appl. No. 16/665,767.
U.S. Non-Final Office Action dated Mar. 7, 2023 in U.S. Appl. No. 16/665,767.
U.S. Non-Final Office Action dated Apr. 24, 2024 in U.S. Appl. No. 16/665,767.
EP Extended European Search Report dated Oct. 30, 2023 in EP Application No. EP20880499.7.
U.S. Final Office Action dated Oct. 13, 2023, in U.S. Appl. No. 16/665,767.

* cited by examiner

MACHINE HEALTH MONITORING

INCORPORATION BY REFERENCE

An Application Data Sheet is filed concurrently with this specification as part of this application. Each application to which this application claims benefit or priority as identified in the concurrently filed Application Data Sheet is incorporated by reference herein in its entirety and for all purposes.

BACKGROUND

The typical industrial facility includes a large number of rotating mechanical and electro-mechanical components such as, for example, various types of induction motors, fans, pumps, etc. Failure of such components can result in extended system shut downs as well as the creation of dangerous and potentially catastrophic conditions.

Electronic monitors have been developed for monitoring motors in such systems. However, most monitors on the market today have issues both with the reliability with which they detect fault conditions, and the fact that most are battery powered and therefore require periodic battery inspection and/or replacement. This, at least partially, defeats the purpose for which these monitors are installed. In addition, given the cost of installing and maintaining these monitors, it is not currently practicable to extend their use to the myriad other types of components that are typically included in such systems.

SUMMARY

According to various implementations, methods, apparatus, devices, systems, and computer program products are provided for machine health monitoring.

According to a particular class of implementations, methods, apparatus, devices, systems, and computer program products are enabled in which a device includes a vibration sensor configured to generate one or more signals representing vibration of a machine component in one or more dimensions. Control circuitry is configured to generate sensor data using the one or more signals generated by the vibration sensor. The control circuitry is configured to generate the sensor data in a first data capture mode by processing the one or more signals generated by the vibration sensor to generate first vibration data. The control circuitry is configured to generate the sensor data in a second data capture mode by processing the one or more signals generated by the vibration sensor to generate second vibration data. At least a portion of the second vibration data is characterized by a higher resolution than a corresponding portion of the first vibration data. A transmitter is configured to transmit the sensor data to a remote device.

According to a specific implementation of this class, the control circuitry is configured to generate the sensor data in an instance of the first data capture mode over a first time period, and to generate the sensor data in an instance of the second data capture mode over a second time period. The second time period is longer than the first time period.

According to another specific implementation of this class, the sensor data generated in an instance of the second data capture mode represent a larger data transmission payload than the sensor data generated in an instance of the first data capture mode.

According to another specific implementation of this class, the control circuitry is configured to generate the sensor data in the first data capture mode more frequently than in the second data capture mode. An instance of the second data capture mode is triggered in relation to one or more instances of the first data capture mode.

According to another specific implementation of this class, the control circuitry is configured to repeatedly generate the sensor data in the first data capture mode in response to repeated instances of a first wakeup message, and to generate the sensor data in the second data capture mode in response to a second wakeup message.

According to another specific implementation of this class, the control circuitry is configured to generate the sensor data in the first data capture mode by processing the one or more signals using a fast Fourier transform to generate frequency-domain vibration data for each of the one or more dimensions. According to a more specific implementation, the frequency-domain vibration data include a plurality of frequency bins, and the control circuitry is further configured to generate the first vibration data by selecting a subset of the frequency bins for transmission to the remote device.

According to another specific implementation of this class, the control circuitry is configured to generate the sensor data by processing the one or more signals generated by the vibration sensor to generate vibrational energy data representing a measurement of vibrational energy of the machine component for the one or more dimensions.

According to another specific implementation of this class, a magnetic field sensor is configured to generate a signal representing a magnetic field associated with the machine component. The control circuitry is further configured to generate the sensor data by processing the signal generated by the magnetic field sensor to generate magnetic field data. According to a more specific implementation, the magnetic field sensor includes a passive coil disposed on one or more layers of a printed circuit board, and an amplifier configured to amplify the signal generated by the magnetic field sensor.

According to another specific implementation of this class, an energy harvesting device is configured to harvest energy from an environment in which the device is deployed. An energy storage device is configured to store at least a portion of the energy harvested by the energy harvesting device. Power management circuitry is configured to control storing of the stored energy by the energy storage device, and to provide power generated from the stored energy to the transmitter and the control circuitry. The stored energy derived from the harvested energy is sufficient to support at least the first and second data capture modes by the control circuitry and transmission of the sensor data by the transmitter.

According to another specific implementation of this class, the sensor data further include machine component temperature data representing a temperature of the machine component, and ambient temperature data representing an ambient temperature of an environment of the machine component.

According to another specific implementation of this class, the machine component is one of a motor, a fan, a pump, or a gearbox.

According to another specific implementation of this class, a magnetic field sensor is configured to generate a signal representing a magnetic field associated with the machine component. The control circuitry is further configured to generate efficiency data based on a relationship between a frequency of the magnetic field and a frequency derived using the one or more signals generated by the vibration sensor. The efficiency data represent an operating efficiency of the machine component.

According to another specific implementation of this class, the control circuitry is configured to generate the sensor data in the first data capture mode by processing the first vibration data to determine a state of the machine component.

According to another class of implementations, methods, apparatus, devices, systems, and computer program products are enabled in which first vibration data generated by a sensing device during a first instance of a first data capture mode are received. The first vibration data represent vibration of a machine component in one or more dimensions. Using the first vibration data it is determined that operation of the machine component is acceptable. Second vibration data generated by the sensing device during a second instance of the first data capture mode are received. The second vibration data represent vibration of the machine component in one or more dimensions. Using the second vibration data it is determined that the operation of the machine component may represent one or more failure modes. A first instance of a second data capture mode by the sensing device is triggered. Third vibration data generated by the sensing device during the first instance of the second data capture mode are received. The third vibration data represent vibration of the machine component. At least a portion of the third vibration data is characterized by a higher resolution than corresponding portions of the first and second vibration data. A state of the machine component is determined using the third vibration data.

According to a specific implementation of this class, the first vibration data represent a first time period and the second vibration data represent a second time period. The first and second time periods have substantially the same duration. The third vibration data represent a third time period. The third time period is longer than the first time period or the second time period.

According to another specific implementation of this class, the third vibration data represent a larger data transmission payload than the first or second vibration data.

According to another specific implementation of this class, a plurality of instances of the first data capture mode by the sensing device are triggered. Triggering of the instances of the first data capture mode are more frequent than triggering of instances of the second data capture mode.

According to another specific implementation of this class, magnetic field data generated by the sensing device are received, the magnetic field data represent a magnetic field associated with the machine component. Determining that the operation of the machine component may represent one or more failure modes includes using the magnetic field data. According to a more specific implementation, efficiency data are generated based on a relationship between a frequency of the magnetic field and a frequency derived using the one or more signals generated by the vibration sensor. The efficiency data represent an operating efficiency of the machine component.

According to another specific implementation of this class, the first vibration data include a subset of less than all of a plurality of bins of fast Fourier transform data generated by the sensing device during the first instance of the first data capture mode. The third vibration data include all of a time-series data set generated by the sensing device during the first instance of the second data capture mode.

According to another specific implementation of this class, triggering the first and second instances of the first data capture mode includes causing a first wakeup code to be transmitted to the sensing device. The first wakeup code is indicative of the first data capture mode. Triggering the first instance of the second data capture mode includes causing a second wakeup code to be transmitted to the sensing device. The second wakeup code is indicative of the second data capture mode.

According to another specific implementation of this class, determining that the operation of the machine component may represent one or more failure modes includes using the first vibration data.

According to another specific implementation of this class, repeated instances of the second data capture mode by the sensing device are triggered. Corresponding vibration data generated by the sensing device during each of the repeated instances of the second data capture mode are received. One or more baseline models representing operation of the machine component are generated based on the vibration data for the repeated instances of the second data capture mode. Determining the state of the machine component includes using the one or more baseline models.

According to another specific implementation of this class, machine component temperature data representing a temperature of the machine component captured during the second instance of the first data capture mode are received. Ambient temperature data representing an ambient temperature of an environment of the machine component captured during the second instance of the first data capture mode are received. Determining that the operation of the machine component may represent one or more failure modes includes using the machine component temperature data and the ambient temperature data.

According to another specific implementation of this class, determining that the operation of the machine component may represent one or more failure modes includes using vibrational energy data representing a measurement of vibrational energy of the machine component for the one or more dimensions. According to a more specific implementation, a user interface plot of the vibrational energy of the machine component over a time period is generated.

According to another specific implementation of this class, the first and second vibration data both include fast Fourier transform data. A user interface waterfall plot including the fast Fourier transform data is generated.

According to another class of implementations, methods, apparatus, devices, systems, and computer program products are enabled in which a device includes a magnetic field sensor configured to generate one or more signals representing a magnetic field associated with a rotating machine component. The magnetic field sensor includes a first passive coil having a first planar orientation, and a second passive coil having a second planar orientation substantially orthogonal to the first planar orientation. Control circuitry is configured to generate magnetic field data using the one or more signals generated by the magnetic field sensor. The magnetic field data represent the magnetic field in at least two dimensions. A transmitter is configured to transmit the magnetic field data to a remote device.

According to a specific implementation of this class, the first passive coil is disposed on a first printed circuit board (PCB) section having the first planar orientation, and the second passive coil is disposed on a second PCB section having the second planar orientation.

According to another class of implementations, methods, apparatus, devices, systems, and computer program products are enabled in which first vibration data generated by a first sensing device associated with a machine component at a first location are received. The first vibration data represent vibration of the machine component in one or more dimensions. Second vibration data generated by a second sensing device associated with the machine component at a second location are received. The second location is spaced apart from the first location. The second vibration data represent vibration of the machine component in one or more dimensions. The first vibration data and the second vibration data are aligned in time, thereby generating time-aligned vibration data. A state of the machine component is determined using the time-aligned vibration data.

According to a specific implementation of this class, aligning the first vibration data and the second vibration data in time includes using timing information associated with a first wakeup message received by the first sensing device and a second wakeup message received by the second sensing device.

According to another specific implementation of this class, magnetic field data generated by one or both of the first and second sensing devices are received. The magnetic field data represent a magnetic field associated with the machine component. Aligning the first vibration data and the second vibration data in time includes using the magnetic field data.

A further understanding of the nature and advantages of various implementations may be realized by reference to the remaining portions of the specification and the drawings.

DETAILED DESCRIPTION

Reference will now be made in detail to specific implementations. Examples of these implementations are illustrated in the accompanying drawings. It should be noted that these examples are described for illustrative purposes and are not intended to limit the scope of this disclosure. Rather, alternatives, modifications, and equivalents of the described implementations are included within the scope of this disclosure as defined by the appended claims. In addition, specific details may be provided in order to promote a thorough understanding of the described implementations. Some implementations within the scope of this disclosure may be practiced without some or all of these details. Further, well known features may not have been described in detail for the sake of clarity.

The present disclosure describes various devices, systems, and techniques relating to the monitoring of different types of components in industrial systems. These devices, systems, and techniques include battery-less monitors that run on power harvested from their environments, systems for acquiring monitor data for the components of the system in a facility (or across multiple facilities), and/or techniques for processing monitor data to reliably determine the status of individual components and potentially other system parameters or states. It should be noted that the described examples may be used in various combinations. It should also be noted that at least some of the examples described herein may be implemented independently of the others. For example, the techniques described herein for processing monitor data may be employed to process data captured using any of a wide variety of monitors including, but not limited to, the monitors described herein. Similarly, the monitors described herein may be used with any of a wide variety of monitoring systems and data processing techniques including, but not limited to, the systems and techniques described herein.

Figure 1:
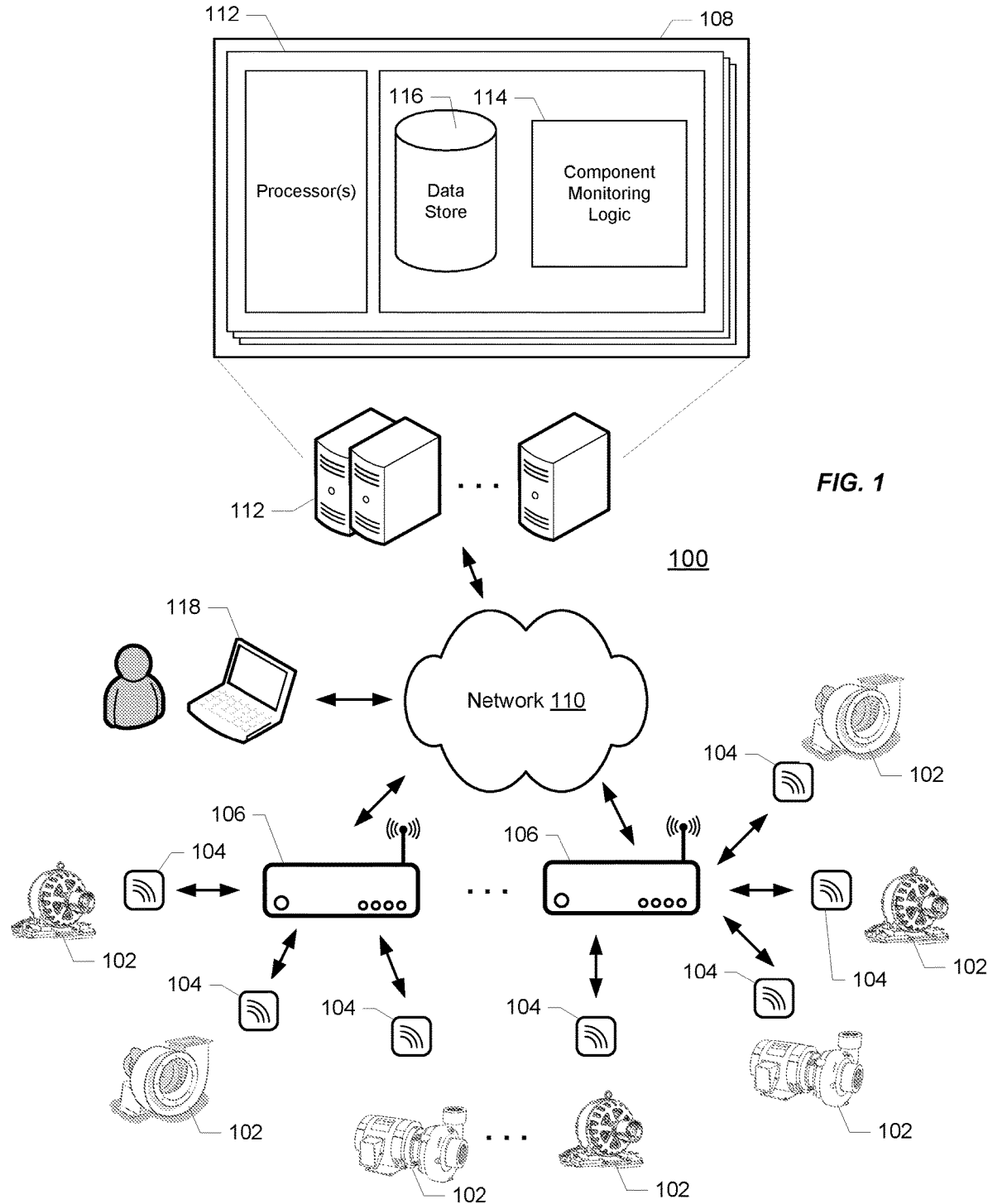
FIG. 1 depicts an example of an industrial system and a cloud-connected monitoring system enabled by the present disclosure.

FIG. 1 depicts a monitoring system 100 for monitoring various types of system components 102 deployed throughout an industrial facility. Components 102 (shown by way of example as motors, fans, and pumps) may be any of a wide variety of devices including, for example, various types of motors (e.g., induction and variable-frequency drive motors), pumps, fans, gearboxes, etc. The details of the system are not shown for reasons of clarity. Moreover, it should be noted that the system of FIG. 1 is merely a simplified example of a system that may be implemented using the techniques described herein. In addition, although the system components in FIG. 1 are depicted as specific types of motors, fans, or pumps, it should be noted that these are merely examples of some of the types of components that may be monitored as described herein. That is, the systems, monitors, and techniques described herein may be used with any of a variety of devices and components including, for example, any of a variety of each of pumps, fans, gearboxes, and the like, without departing from the scope of this disclosure.

Each component 102 has one or more associated monitors 104 mounted on or near the component. Monitors 104 generate various types of sensor data relating to the associated component 102 and/or its adjacent components. Monitors 104 transmit the sensor data to control nodes 106 that, in turn, transmit the sensor data to a monitor data service 108 via network 110. As will be appreciated, the number of monitors 104 and control nodes 106 will vary depending on the application and the facility.

Monitor service 108 may conform to any of a wide variety of architectures such as, for example, a services platform deployed at one or more co-locations, each implemented with one or more servers 112. Monitor service 108 may also be partially or entirely implemented using cloud-based computing resources. Network 110 represents any subset or combination of a wide variety of network environments including, for example, TCP/UDP over IP-based networks, unicast/multicast/broadcast networks, telecommunications networks, wireless networks, satellite networks, cable networks, public networks, private networks, wide area networks, local area networks, the Internet, the World Wide Web, intranets, extranets, and so on.

At least some of the examples described herein contemplate implementations based on computing models that enable ubiquitous, convenient, on-demand network access to a pool of computing resources (e.g., cloud-based networks, servers, storage, applications, and services). As will be understood, such computing resources may be integrated with and/or under the control of the same entity controlling monitor data service 108. Alternatively, such resources may be independent of service 108, e.g., on a platform under control of a separate provider of computing resources with which service 108 connects to consume computing resources as needed, e.g., a cloud-computing platform or service.

It should also be noted that, despite any references to particular computing paradigms and software tools herein, the computer program instructions on which various implementations are based may correspond to any of a wide variety of programming languages, software tools and data formats, may be stored in any type of non-transitory computer-readable storage media or memory device(s), and may be executed according to a variety of computing models including, for example, a client/server model, a peer-to-peer model, on a stand-alone computing device, or according to a distributed computing model in which various functionalities may be effected or employed at different locations.

Monitors 104 may communicate with control nodes 106 using any of a wide variety of wired and wireless protocols and technologies. According to some implementations, control nodes 106 and monitors 104 communicate using a proprietary low-power communication protocol known as Evernet™ provided by Everactive™, Inc., of Santa Clara, California. Examples of such protocols and associated circuitry suitable for use with such implementations are described in U.S. Pat. Nos. 9,020,456 and 9,413,403, and U.S. Patent Publications No. 2014/0269563 and No. 2016/0037486, the entire disclosure of each of which is incorporated herein by reference for all purposes. However, it should be noted that implementations are contemplated in which other modes of communication between the monitors and the rest of the system are employed.

Control nodes 106 may be implemented using any of a variety of suitable industrial Internet gateways, and may connect to monitor service 108 using any of a variety of wired and wireless protocols, e.g., various versions of Ethernet, various cellular (e.g., 3G, LTE, 5G, etc.), various wi-fi (802.11b/g/n, etc.), etc. In some cases, otherwise conventional gateways are augmented to include components that implement the Evernet™ protocol.

Each monitor 104 generates sensor data representing vibration, magnetic field(s), and one or more temperatures associated with the component with which it is associated, and possibly other sensed data associated with the component. Vibration measurements may be captured in one or more dimensions using, for example, one or more accelerometers. Magnetic field measurements may be captured using any of a variety of passive or active devices or circuits. Temperature measurements may be captured using one or more temperature sensors (e.g., thermistors) connected to the component. The monitors may also be configured to capture and generate sensor data representing ambient temperature and/or humidity of the environment in which the monitor is deployed.

According to a particular implementation, in response to a wakeup message from its control node 106 or a local wakeup timer, each monitor 104 transitions from a low-power mode, takes readings on at least some of its sensors, and transmits digitized versions of the readings to its control node 106 in a packet in which each sensor and its reading are paired (e.g., as a label-value pair). The packet also includes information (e.g., in a header) that identifies the specific monitor with a unique identifier and the timestamp of the readings in the packet. The wakeup messages may be periodically transmitted from each control node to its associated monitors. In this way, each monitor 104 "continuously" monitors the component with which it is associated.

Each control node 106 stores the packets received from its monitors 104 in local memory, and periodically or opportunistically uploads the stored information to monitor data service 108 (e.g., to a cloud-based service when the control node is connected to the Internet). Thus, if there is an outage, the control node is able to cache the sensor data until the connection is restored. At least some of the processing of the sensor data may be done by monitor data service 108, e.g., using logic 114. However, it should be noted that implementations are described herein in which at least some of the processing of the data generated by monitors 104 may be performed elsewhere, e.g., by monitors 104 and/or by control nodes 106. Monitor data service 108 may also store historical data for monitoring system 100 (e.g., in data store 116). The monitor data and other system data generated and/or received by monitor data service 108 and stored in data store 116 may be accessed on demand (e.g., in a dashboard on computing device 118) by responsible personnel associated with the facility or facilities in which the monitoring system is deployed.

Figure 2:
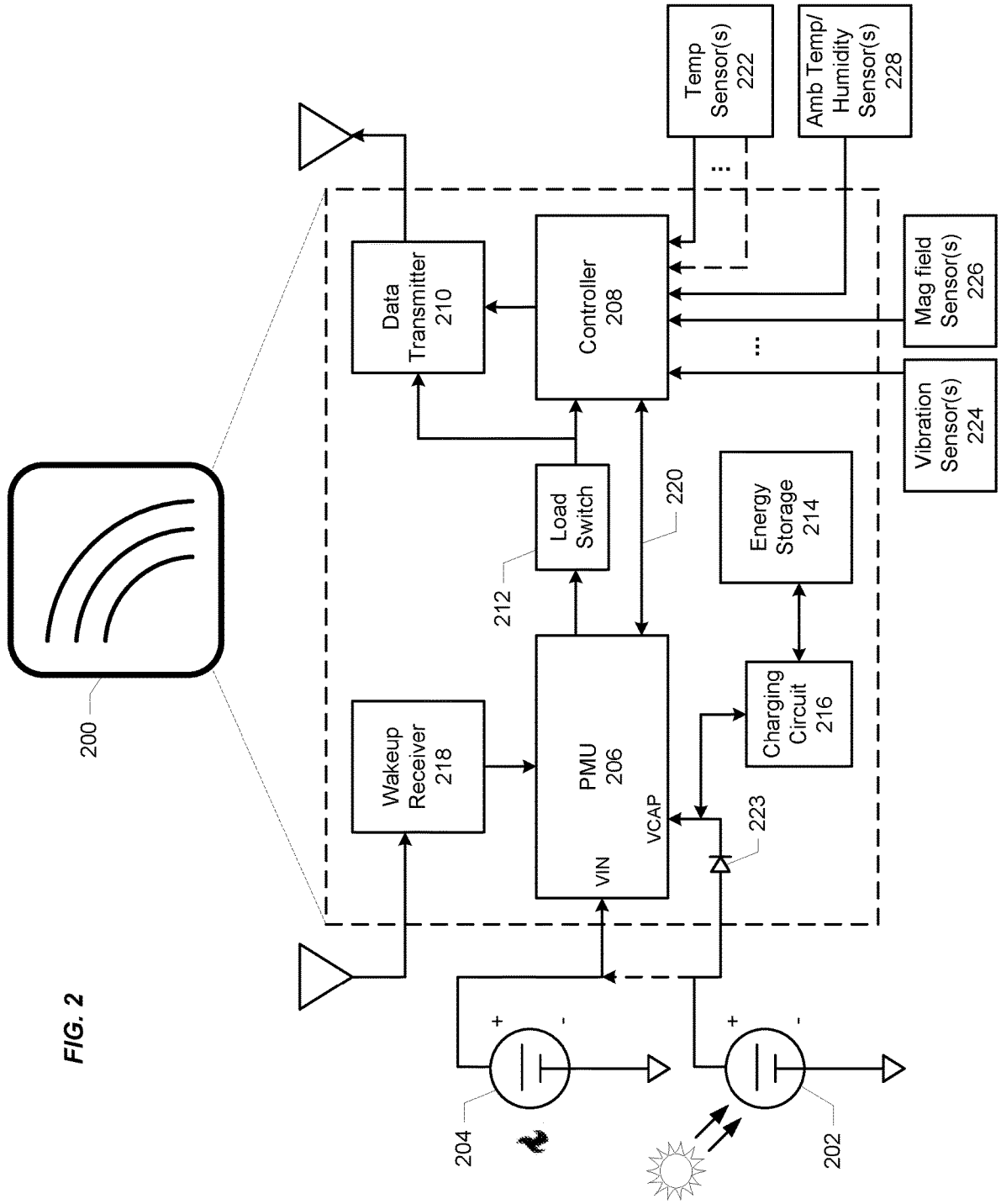
FIG. 2 is a block diagram of a monitor enabled by the present disclosure.

According to some implementations, monitors for components in a system are employed that operate using power harvested from the environments in which they are deployed. FIG. 2 is a block diagram of an example of such a monitor 200. In the depicted implementation, monitor 200 is powered using energy harvested from its environment with a photovoltaic (PV) device 202 that captures energy from the ambient light in the vicinity of monitor 200, and/or a thermoelectric generator (TEG) 204 that captures thermal energy from, for example, the system component being monitored or other nearby components. Implementations are contemplated in which the monitor's power management unit may be configured such that the monitor can use power from the PV device in a "solar only" mode (as indicated by the dashed line from PV device 202 to VIN), the TEG in a "TEG only" mode, or a combination of both in a "solar assist" mode (as indicated by the solid line from PV device 202 to VCAP). Suitable switching circuitry for configuring these connections will be known to those of skill in the art and so is not depicted for clarity.

Monitor 200 includes a power management unit (PMU) 206 that controls the delivery of power to controller 208 and data transmitter 210 via load switch 212. VIN is the harvesting input to PMU 206, and VCAP, and three voltage rails (not shown for clarity) are the generated outputs. PMU 206 charges energy storage device 214 (e.g., a super-capacitor) with VCAP via charging circuit 216 using energy harvested from either or both of PV device 202 and TEG 204 (depending on the harvesting mode). Load switch 212 and charging circuit 216 control energy harvesting and allow monitor 200 to be functional while energy storage device 214 is charging. In some implementations, a load switch is not used, instead relying on the low-power mode or shutdown capabilities of controller 208 and/or the various sensors associated with monitor 200.

Monitor 200 receives a wakeup message (e.g., with wakeup receiver 218) from, for example, a system control node with which it is associated. Receipt of the wakeup message triggers control of load switch 212 by PMU 206 to provide power to controller 208. Controller 208 first determines the status of the sensor's harvested energy. If the energy is sufficient, power is provided to the sensing components for capturing readings associated with the system component being monitored by monitor 200, and to transmitter 210 for transmitting sensor data to the control node. PMU 206 also communicates with controller 208 via digital I/O channel 220. This can be used by the controller to monitor the status of the PMU 206, and to update its configuration or calibration settings.

Once awakened and powered up, controller 208 captures readings using one or more sets of sensors associated with monitor 200. As depicted, these might include one or more temperature sensors 222 (e.g., a thermistor), one or more vibration sensors 224 (e.g., one or more accelerometers), and one or more magnetic field sensors 226 (e.g., a passive coil or a magnetometer). Sensors to detect or measure other parameters or types of readings (e.g., ambient temperature, humidity (e.g., sensor(s) 228), ambient light, acoustic, ultrasonic, mechanical energy, etc.) are also contemplated.

According to some implementations, controller 208 may extract key information from the captured data to minimize the data required to be transmitted to the control node enabling more sensors per control node. Controller 208 may also have the ability to transmit the full raw sensor data set. As discussed above, controller 208 packetizes the digitized sensor data and transmits the packet(s) to the associated sensor node via data transmitter 210.

According to a particular implementation, PMU 206 includes a boost DC-DC converter that employs maximum power point tracking to boost the relatively low voltage VIN received from one of the harvesting sources (e.g., PV device 202 or TEG 204 depending on the mode) to a higher voltage VCAP at its output that is used to charge the energy storage device (e.g., 214). Once VCAP is sufficiently high, a buck/boost, a single-input-multiple-output (SIMO) DC-DC converter turns on and takes VCAP and brings it up or down (depending on the level of charge of energy storage device 214), generating three voltage rails; +2.5, +1.2, and third programmable rail (typically set at +0.6 volts) respectively. These voltage rails are for use in powering the other electronics of monitor 200 (e.g., controller 208 and transmitter 210).

In the "solar assist" harvesting mode, PV device 202 may be attached directly to VCAP through diode 223 (to prevent leakage) as represented by the solid line connection in FIG. 2. In this mode, and assuming its output is sufficient to forward bias diode 223, PV device 202 may provide a charging assist to TEG 204 with the energy of the two harvesting sources naturally combining in energy storage device 214 without requiring complicated control electronics. According to a particular implementation, in the "solar assist" mode, PV device 202 is used to raise VCAP such that the biasing to the boost converter turns on. This allows the boost to harvest from lower input voltages (e.g., allowing harvesting from lower temperature deltas on TEG 204). In another implementation, PV device 202 may connect to VIN of PMU 206 as shown by the dashed line in FIG. 2. This allows for lower levels of light, or lower voltage PV cells to be boosted to recharge the energy storage element.

Alternatively, the solar harvester can be connected directly to the PMU boost converter while the TEG harvester, utilizing an additional boost circuit, is connected to VCAP through a diode, thus providing multiple harvesting sources in parallel.

More generally, implementations are enabled by the present disclosure in which energy may be harvested from multiple different energy sources and used in any combination to power such monitor. Other potential sources for harvesting include vibration energy (e.g., using a piezoelectric-based or a linear motion, electromagnetic-based device), magnetic fields (e.g., using magnetic field sensor(s) 226), RF energy, electromagnetic fields (e.g., using a coil to harvest stray leakage of the rotating electromagnetic field originating from a motor stator coil), etc. As will be appreciated, these are AC energy sources and so would require AC-DC converters. And if the resulting DC voltages from any of these are not sufficiently high, they could be boosted using a boost converter.

The processing of monitor data according to a particular class of implementations will now be described. In the following description, references are made to the monitoring of induction-type motors. It should be noted that these references are for illustrative purposes only and that the techniques described may be applied to a wide range of component types. The scope of the present disclosure should therefore not be limited with reference to any particular component type.

According to various implementations, a monitor (also referred to herein as a machine health monitor or MHM) is placed on a piece of rotating machinery (e.g., a motor) and provides diagnostics data for vibration in three axes, the magnetic field of the motor, the surface temperature of the motor body, and the ambient temperature and humidity of the deployment environment. As discussed above, the MHM may be a self-powered, energy harvesting monitor with no batteries (and therefore no maintenance in this regard).

The types of facilities in which an MHM might be deployed include, for example, water distribution facilities (e.g., pump motors), HVAC systems for large buildings (e.g., fan blade motors), food processing and packaging facilities (e.g., homogenizers, dairy processing motors, assembly line motors, mixers), refineries (e.g., oil pumps), etc.

In the context of motor monitoring, the monitor may be mounted over the bearings of the motor as that is where problematic vibration would be the most apparent. The temperature of what is expected to be the hottest part of the motor body is also monitored to ensure it stays within its rating. The ambient temperature is measured inside or adjacent the monitor.

According to particular implementation, the energy used to support operation of the monitor is heat energy harvested using a thermo-electric generator (TEG) and is based on the temperature differential between the motor body temperature and the ambient temperature. The custom silicon inside the monitor allows us to operate on harvested power alone. As mentioned above, implementations are contemplated that also or alternatively harvest ambient light, magnetic energy, vibration or other mechanical energy, electromagnetic fields, etc.

An ultra-low-power wakeup receiver wakes up the sensor circuitry of the monitor when it receives a wakeup code from an associated control node and the monitor takes a snap shot of the sensor data for the component being monitored. Depending on the complexity of the machine being monitored, there may be one or several sensors on the machine, the data from which can be taken substantially simultaneously to capture a synchronized snapshot of the machine's health.

According to some implementations, the sensor data (e.g., low or high resolution snapshots) from multiple monitors placed at different locations on a component may be combined to provide additional information about the state of the component. For example, the vibration data from the different monitors may be aligned in phase based on the timing of the respective wakeup signals to the monitors. These aligned data may, in turn, enable distinguishing foundation vibrations (in which all of the monitors record the same phase-coherent vibration waveform) from relative vibrations between the monitors (which might originate, for example, from shaft "wobble" or some other potential failure indicator). In another example, the time-varying magnetic field data obtained from the magnetic field sensor may be used for phase-alignment of vibration data from two or more monitors.

According to a particular subset of implementations, the monitor runs on so little energy that is directly harvested from the monitor's environment that it does not need a battery, allowing customers to "install and forget." The monitor is so low power because the vast majority of its circuitry remains either off or in a very low power mode most of the time and then, using the wakeup receiver, is selectively enabled as needed to collect the data.

Figure 3:
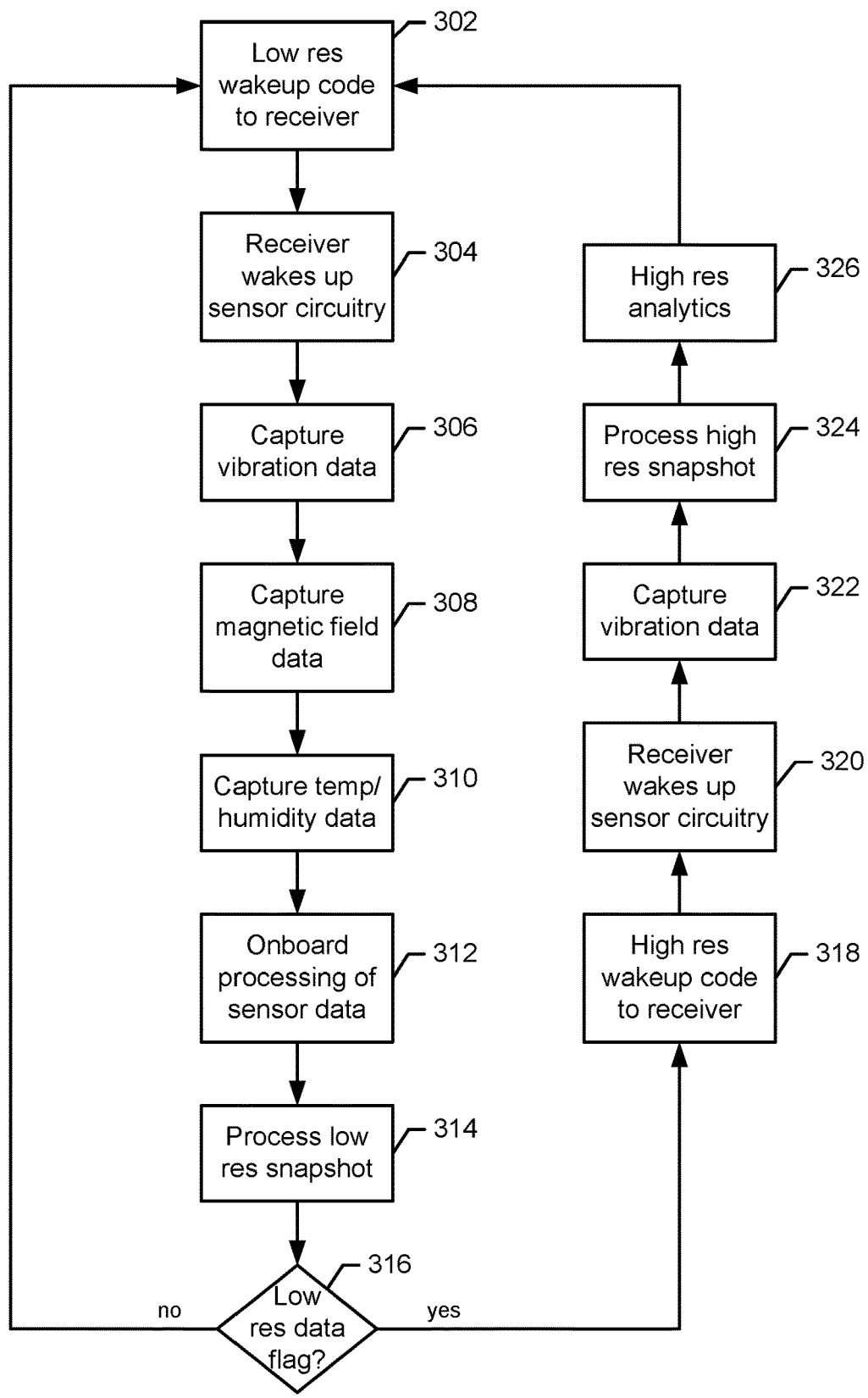
FIG. 3 is a flowchart illustrating operation of a particular class of implementations enabled by the present disclosure.

Referring now to FIG. 3, the wakeup receiver receives a wakeup code (302), e.g., a bit sequence in an RF signal (which may signal a low resolution snapshot), and then wakes up the other circuitry of the monitor (304) (which may do something like flash an LED to indicate that it received the wakeup). The monitor then turns on the accelerometer(s) which takes that data and then shuts down (306). The monitor also turns on an amplifier that amplifies the signal from a passive magnetic field loop coil built into the monitor and then shuts down (308). This is to be distinguished from other products that use a magnetometer for this purpose. The monitor also turns the temperature and humidity sensors on and off, collecting those measurements (310).

Instead of a power-hungry magnetometer that most conventional monitors use, a passive coil is provided (e.g., on a printed circuit board in the monitor) that captures the magnetic field of the motor which is then amplified by a very low power amplifier and sampled and digitized by an ultra-low-power on-chip ADC. This is a very low power approach compared to the use of a magnetometer which uses a lot of power, not only to power the sensor element, and amplify, filter, sample, and digitize the sensor signal, but for transmitting the digital data through an off-chip interface. A particular implementation of a magnetic field sensor using a passive coil is shown in FIGS. 4A and 4B.

Figure 4A:
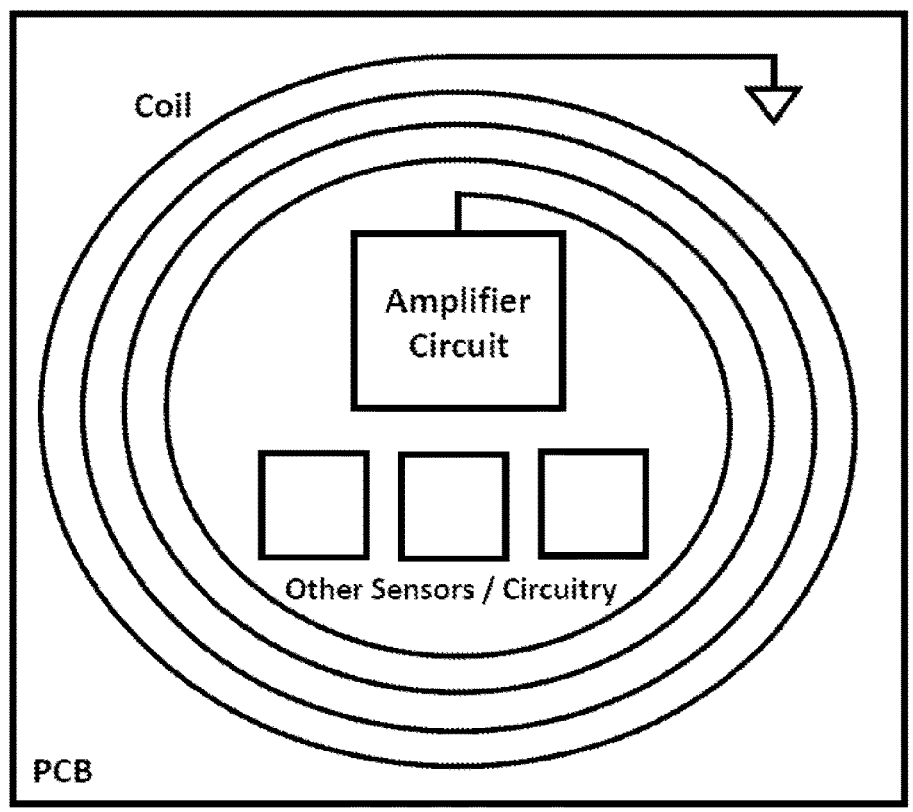
FIGS. 4A and 4B are diagrams illustrating a magnetic field sensor configured for capturing the magnetic field of a machine component.
Figure 4B:
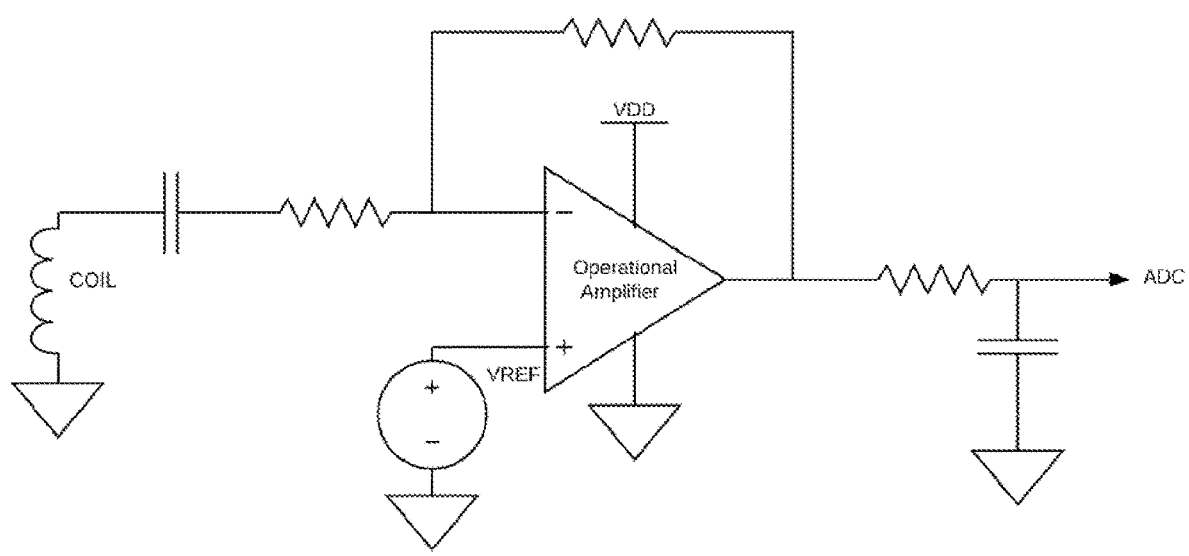

The magnetic field sensor depicted in FIGS. 4A and 4B includes a multi-turn passive coil constructed from copper traces on a PCB. In some implementations, the coil can be replaced by a ferrite-core inductor. The coil is configured for measuring the magnetic field generated by a rotating machine component such as, for example, the stator coil of an induction motor. The signal from the coil is amplified by a very low-power amplifier such as, for example, an op amp configured to operate in the micro or nano-watt range.

According to a particular implementation, the passive coil is a 20-turn coil implemented with a 6 mil trace and spacing in two layers of the PCB (i.e., 10 turns per layer). According to a particular implementation, the op amp used for coil or inductor amplification is a 600 nA, 100 kHz GBW opamp (e.g., MCP6141). Additional turns to suit a particular application may be introduced, for example, by providing additional PCB layers.

As will be appreciated, such an approach to magnetic field sensing is superior to the typical active magnetometer both in terms of cost and power consumption (an important performance metric in the context of a battery-less monitor). The use of a passive coil also allows for much higher sampling rates than a magnetometer because the ADC can be implemented on-chip and therefore not limited by constraints such as those associated with inter-chip serial interfaces. In addition, a passive coil will typically be compatible with the presence of a permanent magnet whereas a magnetometer will not.

According to Faraday's law, an electromagnetic field is induced in a conductive loop when the magnetic flux through a surface enclosed by the loop varies in time. In other words, a coil converts a time-varying magnetic field into a time-varying voltage. The stator coils on a motor generate a rotating (and thus time-varying) magnetic field to turn the rotor shaft. The passive coil is used to monitor this field to capture its frequency content, e.g., for determining motor efficiency and potentially identifying certain kinds of mechanical wear or failure modes.

The PCB-trace coil serves as a pickup coil for converting this rotating magnetic field into a voltage that is amplified and filtered for digitization using the circuit shown in FIG. 4B. Note that this voltage is a function of the time-varying magnetic field (rate of change), whereas a magnetometer produces data that is a function of the instantaneous magnetic field. In other words, the pickup coil produces data that is the derivative of the data produced by the magnetometer.

According to some implementations, one or more additional coil(s) may be provided that are oriented in orthogonal plane(s) with respect to the first coil. This enables sensing and computing two-dimensional or three-dimensional representations (e.g., vectors) of the rotating magnetic field. Such orthogonal coil geometries can be implemented, for example, using flexible or rigid-flex PCB technology or other techniques familiar to those skilled in the art.

In some data capture modes, the monitor does post processing on the captured signals, e.g., using controller 208. This may include a fast Fourier transform (FFT) on the accelerometer data, as well as a root-mean-square (RMS) measurement of the accelerometer data. As will be discussed, the RMS measurement is a representation of the total vibrational energy that allows efficient tracking of trends in this energy over time. The FFT is a more detailed view while the RMS is like a single-point representation that can quickly tell you if anything is changing over time that might precipitate a more detailed look. These data may also include the fundamental operating frequency for each axis of vibration (e.g., ranging from 6 Hz to 3,200 Hz), as well as the magnitudes of the fundamental, harmonic, and sideband frequencies (e.g., up to 10 measurements) for each axis.

Because each monitor is so low power, data capture snapshots can be taken more frequently than conventional monitors. For example, data capture can occur every 15 to 30 seconds which allows for quicker detection of and reaction to potential failures. With a new generation of monitor silicon currently being tested, implementations are contemplated in which snapshots are captured even more frequently (e.g., every 3 or 4 seconds). This is compared with the sample times for conventional monitors which can sample at most once a minute, but dramatically reduce battery life if they do so.

According to a particular class of implementations, different levels of data capture may be performed with an increased level of data capture (a high-resolution snapshot) being triggered by any of a variety of flags that are based on a lower level of data capture (a low-resolution snapshot). According to these implementations and as shown in FIG. 3, a low-resolution snapshot can be taken and processed (314) on a recurring and frequent basis and, if a threshold for any of a number of data types for a given monitor gets tripped or data is outside of a range (316), a different wakeup code message can be sent to the monitor (318) that will trigger a more detailed, high-resolution data capture for that monitor (320-326).

For the low resolution snapshot, the monitor may preprocess the captured measurements (312) to reduce the amount of data sent up to the cloud. This computation at the edge minimizes the traffic in the network and allows more monitors to talk to the gateway(s). The logic in the cloud can then determine whether any thresholds have been tripped or any trends are problematic and, if so, send a wakeup code for a high-resolution snapshot to the relevant monitor(s). A monitor that receives this wakeup code then takes the high-resolution snapshot and requests a bigger timeslot in the network communication protocol so that it can send up a larger set of the high-resolution data for processing in the cloud.

Implementations are contemplated in which the onboard processing of sensor data performed by the monitor may include determining whether the sensor data represent or potentially indicate a fault condition. This might include, for example, the monitor firmware determining a "good" or "bad" status based on captured sensor data being in or out of expected levels or ranges, and then responding to wakeup messages with very simple status responses, e.g., "good," "bad," or "condition unchanged." As will be appreciated, the payload for such responses represents a very small footprint in terms of wireless data in the monitoring network.

According to a particular implementation, the low-resolution snapshot takes about 0.5 seconds of accelerometer data (e.g., sampled at 6 kHz) and runs the data for each of the three axes of vibration through an FFT. This results in a number of frequency bins (e.g., 2048) for each of the three axes. Some number of the highest magnitude bins (e.g., 15-20) are selected for each of the axes for transmission to the cloud. In some cases, the number could be variable. For example, only the bins that have magnitudes over a certain level might be sent. According to some implementations, the bins may be selected to ensure that bins are selected from each of a number of different frequency ranges across the entire range spanned by the FFT bins so that the reduced data set includes data from each of those ranges. This may be important, for example, for identifying and tracking particular types of failures that show up in specific frequency ranges.

Figure 5:
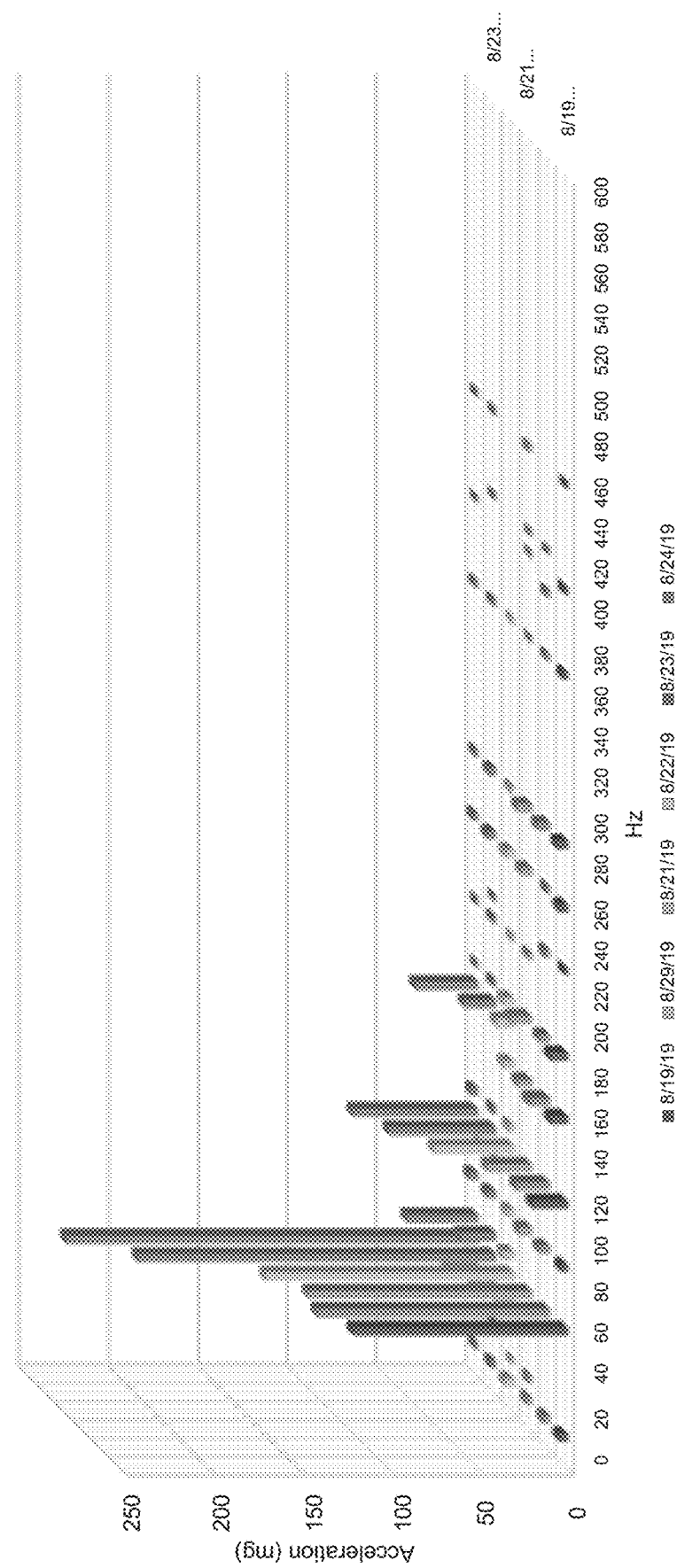
FIG. 5 shows an example of a waterfall plot of fast Fourier transform (FFT) data.
Figure 6:
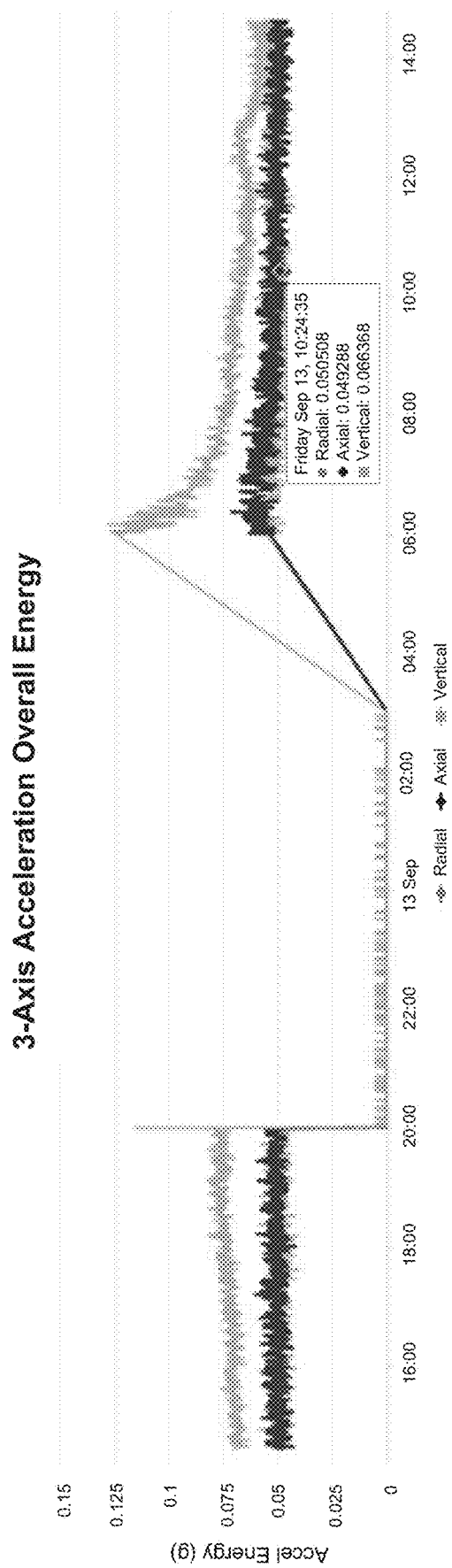
FIG. 6 shows an example of an RMS measurement of vibration data.

Based on the low-resolution data sent the cloud, a waterfall plot of the FFT results can be generated over time so that it can be determined whether they remain consistent, or if there are variations or trends that are predictive of trouble. This can include comparison of data over time for a single component as well as comparison of data from different components, e.g., vibration went down for one component and up on another. An example of a waterfall plot of FFT results is shown in FIG. 5. An example of a plot of the RMS measurement for three axes of vibration is shown in FIG. 6.

According to a particular implementation, the low-resolution snapshot includes magnetic field measurements that are also run through an FFT (potential of lower resolution) and for which the data for a fewer number of the bins are sent to the cloud (e.g., 2 bins). This is because fewer data points are required to get an accurate reading of the motor's running frequency. These data may include magnetic field fundamental and harmonic operating frequency magnitudes (e.g., two measurements).

The low-resolution snapshot also includes two temperatures (ambient temperature and component body or skin temperature) and humidity, all three of which may be single values for the snapshot. The component body temperature relative to the ambient temperature is representative of the state of the component, e.g., whether anything is going wrong with the motor. And because heat energy is being harvested, the monitor already has something touching the component body and so, unlike many conventional monitors, the monitor has access to this information. Further, because the body temperature is also used to power the TEG (again relative to the ambient temperature), it can be used to determine whether there is enough energy being harvested to power the monitor. In addition, most motors are rated for an ambient temperature range, so ambient temperature thresholds can be set to trigger an alarm when the operating environment of the motor gets too hot.

Humidity data is captured along with ambient temperature using a combination sensor that is turned on in response to the wakeup, takes both measurements, and then the sensor is turned off. Humidity may be useful for monitoring the health of the environment. For example, if a steam valve in the system fails that would increase the humidity with any nearby monitors indicating that something has gone wrong in their vicinity.

The monitor can include energy-awareness logic (e.g., onboard firmware embodied by controller 208) to preserve energy. One function of this logic would be to determine whether the motor is on or off, e.g., based on temperature, accelerometer, or magnetic measurements. The magnetic field monitoring is the lowest power and so that is likely the best one to use. If the motor is off, the monitor may be configured to ignore any wakeup codes or respond to the wakeup code with a message that the motor is off without taking any data. This would be particularly important for facilities in which the equipment is off for long durations, e.g., HVAC systems in large buildings are often turned off at night.

The energy-awareness logic can also sample the charge on the energy storage capacitor to determine whether the monitor has enough energy to take data. If not, it can ignore the wakeup code and/or send a message to the system that it doesn't have sufficient charge for data collection at the moment. Once it has charged up enough it can resume its normal response to the wakeup code.

According to a particular implementation, in response to a wakeup message, the monitor checks first if it has enough charge for data collection, and then second if the motor is on. If it doesn't have enough energy or the motor is off, it will return to its low-power state and possibly send a corresponding message to the system.

The low-resolution sensor data may be processed to identify trends that might be indicative of something to be concerned about. User-defined thresholds may be set for any of the data captured including, for example, the overall accelerometer energy level, the energy level for each axis of vibration, whether the rotational speed of the magnetic field is too high (i.e., the motor is running too fast), if the ambient temperature is too high, if the delta between the body and the ambient temperature is too high, etc. All of these can be trended and/or have an associated threshold that, if hit, will trigger a notification and/or a high-resolution snapshot for the corresponding monitor(s).

Specific windows of the FFT results may also be processed to capture different failure types that are represented in different frequency ranges, e.g., if the magnitude(s) of a specific bin or group of bins representing a particular frequency range exceeds a threshold.

When a threshold is tripped or a trend is recognized, the control node sends a wakeup code to the corresponding monitor to capture a high-resolution snapshot. According to a particular implementation, the high-resolution snapshot involves a much longer sample window than the low-resolution snapshot (e.g., several seconds) in which accelerometer data are captured. According to a particular implementation, the raw time-series data are sent to the cloud for processing with as high a resolution FFT as desired (e.g., even more than the number of bins for the low-resolution snapshot). This will result in a much higher resolution vibration data set for processing. In some implementations, only accelerometer data are captured in the high resolution snapshot. However, any of the other sensor data for which capture is supported can be added to provide additional meaningful information. In some cases, the low resolution snapshots will provide enough resolution of these other data to be able to derive anything meaningful.

As mentioned above, the wakeup codes for the low and high-resolution snapshots may be different so as to notify the monitor of the requested data capture modes. In addition, different wakeup codes might correspond to different types of high-resolution snapshots. For example, if the data from a low-resolution snapshot is indicative of a particular class of failure, a particular type of high-resolution snapshot might be captured that focuses on capturing the types or ranges of data that would be most relevant to that class of failure.

As discussed above, the raw time series accelerometer data may be processed with a high resolution FFT in the cloud to identify failure modes. To facilitate this, high resolution snapshots may be taken periodically (e.g., once a day) when the system is operating normally so that baseline models of normal system behavior can be generated. These baseline models can be used to identify deviations from the baselines, but also various FFT data signatures that correlate with specific types of failures, e.g., the motor is unbalanced, or a bearing fault has occurred.

For example motor unbalance might be characterized by the RPM or operating frequency of the motor decreasing significantly. In another example, a bearing failure might be characterized by much higher frequency content and also might depend on the number of balls in the bearing, whether the failure is on the inner race or the outer race, and how fast the motor is running, it will give a higher magnitude at each of the frequencies that lines up with the mathematical equation for each type of bearing failure. In another example, a loose motor foundation might be characterized by an elevated noise floor (because the entire motor assembly is shaking). In another example, the relative efficiency of a motor may be determined by measuring motor slip, e.g., by measuring the frequency of the magnetic field driving the motor vs. the frequency of the actual velocity of the motor measured by the accelerometer. An increase in the delta between the magnetic field frequency and the measured motor velocity may indicate a decrease in the motor efficiency. The higher resolution FFT results will allow for each of these different types of failures to be recognized. Moreover, many failure types will also show up in the trends of the overall energy derived from the low-resolution data. Thus, if such a trend is identified, a corresponding high resolution snapshot may be triggered to make a more detailed determination.

As the algorithms learn the models, they can begin to recognize an impending failure or trigger a high resolution snapshot even before a threshold has been tripped based on the trending data. This might be useful, for example, for a facility in which there are many monitors so that the operators don't have to manually set many thresholds for each component being monitored.

It will be understood by those skilled in the art that changes in the form and details of the implementations described herein may be made without departing from the scope of this disclosure. For example, different modes of data capture have been described above using the terms "low resolution" and "high resolution." It should be understood, however, that these terms are used for explanatory purposes and that neither the terms themselves nor specific characteristics of the described data capture modes should be used to unduly limit the scope of this disclosure. More generally, implementations are contemplated in which a first and more frequent data capture mode is used to trigger a second data capture mode in which more fine-grained and/or specifically focused data are obtained from one or more monitors. The difference(s) between the two data capture modes may vary depending on the particular implementation. For example, the two data capture modes may differ in terms of one or more of the following: the type(s) of sensor data captured, the size of the payload transmitted by the monitor, the onboard processing of sensor data performed by the monitor, the processing of sensor data performed by the control node or in the cloud, the domain of the resulting data (e.g., time vs. frequency) and/or the level of detail or resolution of information content (e.g., fine vs. coarse, fully-sampled vs. sparse, etc.).

In addition, although various advantages, aspects, and objects have been described with reference to various implementations, the scope of this disclosure should not be limited by reference to such advantages, aspects, and objects. Rather, the scope of this disclosure should be determined with reference to the appended claims.

What is claimed is:

1. A device, comprising:
a magnetic field sensor configured to generate one or more signals representing a magnetic field associated with a machine component, the magnetic field sensor including a first passive coil having a first planar orientation and a second passive coil having a second planar orientation substantially orthogonal to the first planar orientation to enable representing the magnetic field in at least two dimensions;
a first vibration sensor configured to generate a first vibration signal representing vibration of the machine component in one or more dimensions, the first vibration sensor associated with the machine component at a first location;
a second vibration sensor configured to generate a second vibration signal representing vibration of the machine component in one or more dimensions, the second vibration sensor associated with the machine component at a second location, the second location being spaced apart from the first location;
control circuitry configured to:
generate magnetic field data using the one or more signals generated by the magnetic field sensor, the magnetic field data representing the magnetic field in at least two dimensions,
generate first vibration data using the first vibration signal and second vibration data using the second vibration signal, and
align the first vibration data and the second vibration data in time using the magnetic field data, thereby generating time-aligned vibration data; and
a transmitter configured to transmit the magnetic field data and the time-aligned vibration data to a remote device, the magnetic field data and the time-aligned vibration data configured to be processed to determine a state of the machine component.

2. The device of claim 1, wherein the first passive coil is disposed on a first printed circuit board (PCB) section having the first planar orientation, and wherein the second passive coil is disposed on a second PCB section having the second planar orientation.

3. The device of claim 2, wherein a first turn of the first passive coil is on a first layer of the first PCB, and a second turn of the first passive coil is on a second layer of the first PCB.

4. The device of claim 1, wherein the first passive coil is implemented as a first ferrite-core inductor, and the second passive coil is implemented as a second ferrite-core inductor.

5. The device of claim 1, wherein the control circuitry is further configured to generate the first vibration data in a first data capture mode by processing the first vibration signal, wherein the control circuitry is further configured to generate the second vibration data in a second data capture mode by processing the second vibration signal, wherein at least a portion of the second vibration data is characterized by a higher resolution than a corresponding portion of the first vibration data, and wherein the second data capture mode is triggered based on the magnetic field data.

6. The device of claim 1, further comprising an amplifier configured to amplify the one or more signals generated by the magnetic field sensor, wherein the control circuitry is configured to control power to the amplifier in response to a wakeup message.

7. The device of claim 1, wherein the control circuitry is further configured to determine that the machine component is off based on the magnetic field data, and to ignore a wakeup message or respond to the wakeup message with a response message indicating that the machine component is off.

8. The device of claim 1, wherein the control circuitry is further configured to generate efficiency data representing a relationship between a frequency of the magnetic field and a frequency represented by one or more of the vibration signals, the efficiency data representing an operating efficiency of the machine component.

9. The device of claim 1, wherein the control circuitry is configured to generate the magnetic field data using a fast Fourier transform (FFT) to generate FFT data, and wherein the control circuitry is configured to include fewer than all the FFT data in the magnetic field data.

10. A method, comprising:
receiving magnetic field data based on one or more signals generated by a magnetic field sensor associated with a machine component, the magnetic field sensor including a first passive coil having a first orientation and a second passive coil having a second orientation substantially orthogonal to the first orientation to enable the magnetic field data to represent a magnetic field associated with the machine component in at least two dimensions;
receiving first vibration data generated by a first sensing device associated with the machine component at a first location, the first vibration data representing vibration of the machine component in one or more dimensions;
receiving second vibration data generated by a second sensing device associated with the machine component at a second location, the second location being spaced apart from the first location, the second vibration data representing vibration of the machine component in one or more dimensions;
aligning the first vibration data and the second vibration data in time using the magnetic field data, thereby generating time-aligned vibration data; and
determining a state of the machine component using the magnetic field data and using the time-aligned vibration data.

11. The method of claim 10, wherein determining the state of the machine component includes determining an efficiency of the machine component based on frequency content of the magnetic field data.

12. The method of claim 10, wherein determining the state of the machine component includes identifying mechanical wear of the machine component based on frequency content of the magnetic field data.

13. The method of claim 10, wherein determining the state of the machine component includes determining one or more failure modes of the machine component based on frequency content of the magnetic field data.

14. The method of claim 10, wherein determining the state of the machine component includes determining that the machine component is off based on the magnetic field data.

15. The method of claim 10, wherein the magnetic field data include fast Fourier transform (FFT) data representing the magnetic field.

16. The method of claim 10, wherein determining the state of the machine component includes determining that a rotational speed of the machine component exceeds a threshold.

17. The method of claim 10, wherein the first vibration data is generated in a first data capture mode, the method further comprising:
determining using the magnetic field data that operation of the machine component may represent one or more failure modes; and
triggering a second data capture mode; wherein
the second vibration data is generated in the second data capture mode, and wherein at least a portion of the second vibration data is characterized by a higher resolution than a corresponding portion of the first vibration data.

18. The method of claim 10, further comprising:
generating efficiency data based on a relationship between a frequency of the magnetic field data and a frequency of vibration data, the efficiency data representing an operating efficiency of the machine component.

19. The method of claim 10, further comprising:
triggering repeated instances of a data capture mode in which the magnetic field data are generated;
receiving portions of the magnetic field data for each of the repeated instances of the data capture mode; and
generating one or more baseline models representing operation of the machine component based on the portions of the magnetic field data for the repeated instances of the data capture mode;
wherein determining the state of the machine component includes using the one or more baseline models.

20. A system, comprising one or more processors and memory configured to:
receive magnetic field data based on one or more signals generated by a magnetic field sensor associated with a machine component, the magnetic field sensor including a first passive coil having a first orientation and a second passive coil having a second orientation substantially orthogonal to the first orientation to enable the magnetic field data to represent a magnetic field associated with the machine component in at least two dimensions;
receive first vibration data generated by a first sensing device associated with the machine component at a first location, the first vibration data representing vibration of the machine component in one or more dimensions;
receive second vibration data generated by a second sensing device associated with the machine component at a second location, the second location being spaced apart from the first location, the second vibration data representing vibration of the machine component in one or more dimensions;

align the first vibration data and the second vibration data in time using the magnetic field data, thereby generating time-aligned vibration data; and determine a state of the machine component using the magnetic field data and using the time-aligned vibration data.

21. The system of claim 20, wherein the one or more processors and memory are configured to determine the state of the machine component by determining an efficiency of the machine component based on frequency content of the magnetic field data.

22. The system of claim 20, wherein the one or more processors and memory are configured to determine the state of the machine component by identifying mechanical wear of the machine component based on frequency content of the magnetic field data.

23. The system of claim 20, wherein the one or more processors and memory are configured to determine the state of the machine component by determining one or more failure modes of the machine component based on frequency content of the magnetic field data.

24. The system of claim 20, wherein the one or more processors and memory are configured to determine the state of the machine component by determining that the machine component is off based on the magnetic field data.

25. The system of claim 20, wherein the magnetic field data include fast Fourier transform (FFT) data representing the magnetic field.

26. The system of claim 20, wherein the one or more processors and memory are configured to determine the state of the machine component by determining that a rotational speed of the machine component exceeds a threshold.

27. The system of claim 20, wherein the first vibration data is generated in a first data capture mode, wherein the one or more processors and memory are further configured to:

determine using the magnetic field data that operation of the machine component may represent one or more failure modes;

trigger a second data capture mode; wherein the second vibration data is generated in the second data capture mode, and wherein at least a portion of the second vibration data is characterized by a higher resolution than a corresponding portion of the first vibration data.

28. The system of claim 20, wherein the one or more processors and memory are further configured to:

generate efficiency data based on a relationship between a frequency of the magnetic field data and a frequency of vibration data, the efficiency data representing an operating efficiency of the machine component.

29. The system of claim 20, wherein the one or more processors and memory are further configured to:

trigger repeated instances of a data capture mode in which the magnetic field data are generated;

receive portions of the magnetic field data for each of the repeated instances of the data capture mode; and generate one or more baseline models representing operation of the machine component based on the portions of the magnetic field data for the repeated instances of the data capture mode;

and wherein the one or more processors and memory are configured to determine the state of the machine component using the one or more baseline models.

* * * * *